(12) United States Patent
Ryu et al.

(10) Patent No.: US 9,590,073 B2
(45) Date of Patent: Mar. 7, 2017

(54) METHODS OF FABRICATING SEMICONDUCTOR DEVICES

(71) Applicant: Samsung Electronics Co., Ltd., Suwon-si, Gyeonggi-do (KR)

(72) Inventors: Yeon-Tack Ryu, Yongin-si (KR); Ho-Young Kim, Seongnam-si (KR); Myoung-Hwan Oh, Hwaseong-si (KR); Bo-Un Yoon, Seoul (KR); Jun-Hwan Yim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/815,225

(22) Filed: Jul. 31, 2015

(65) Prior Publication Data

US 2016/0104788 A1    Apr. 14, 2016

(30) Foreign Application Priority Data

Oct. 14, 2014  (KR) .................. 10-2014-0138276

(51) Int. Cl.
*H01L 21/00* (2006.01)
*H01L 29/66* (2006.01)
*H01L 29/49* (2006.01)
*H01L 29/51* (2006.01)
(Continued)

(52) U.S. Cl.
CPC .. *H01L 29/66545* (2013.01); *H01L 21/76829* (2013.01); *H01L 21/76834* (2013.01); *H01L 21/76897* (2013.01); *H01L 21/823437* (2013.01); *H01L 29/4958* (2013.01);
(Continued)

(58) Field of Classification Search
CPC ............. H01L 21/283; H01L 29/66545; H01L 29/4958; H01L 29/4966; H01L 29/513; H01L 29/517; H01L 21/823437; H01L 21/76897; H01L 21/76829; H01L 21/76834
See application file for complete search history.

(56) References Cited

U.S. PATENT DOCUMENTS 6,746,314 B2    6/2004 Kim et al.
6,764,884 B1    7/2004 Yu et al.
(Continued)

FOREIGN PATENT DOCUMENTS

KR    1020030058033    7/2003
KR    1020050074834    7/2005
(Continued)

*Primary Examiner* — Richard Booth
(74) *Attorney, Agent, or Firm* — Myers Bigel, P.A.

(57) ABSTRACT

Semiconductor devices and methods of fabricating semiconductor devices are provided. The methods may include forming an interlayer insulation layer on a substrate. The interlayer insulation layer may surround a dummy silicon gate and may expose a top surface of the dummy silicon gate. The methods may also include recessing a portion of the interlayer insulation layer such that a portion of the dummy silicon gate protrudes above a top surface of the recessed interlayer insulation layer and forming an etch stop layer on the recessed interlayer insulation layer. A top surface of the etch stop layer may be coplanarly positioned with the top surface of the dummy silicon gate. The methods may further include forming a trench exposing the substrate by removing the dummy silicon gate using the etch stop layer as a mask.

17 Claims, 12 Drawing Sheets

(51) Int. Cl.
   *H01L 21/8234* (2006.01)
   *H01L 21/768* (2006.01)

(52) U.S. Cl.
   CPC ........ *H01L 29/4966* (2013.01); *H01L 29/513* (2013.01); *H01L 29/517* (2013.01)

(56) References Cited

U.S. PATENT DOCUMENTS

| | | | |
|---|---|---|---|
| 6,812,106 B1 * | 11/2004 | Xiang | H01L 21/26506 257/E21.335 |
| 7,285,456 B2 | 10/2007 | Kim et al. | |
| 7,361,958 B2 | 4/2008 | Brask et al. | |
| 8,354,313 B2 | 1/2013 | Kwon et al. | |
| 8,492,228 B1 | 7/2013 | Leobandung et al. | |
| 8,652,910 B2 | 2/2014 | Kang et al. | |
| 8,673,707 B2 | 3/2014 | He et al. | |
| 8,853,088 B2 | 10/2014 | Kim et al. | |
| 2011/0244670 A1 | 10/2011 | Richter et al. | |
| 2012/0080755 A1 | 4/2012 | Kim et al. | |
| 2013/0214335 A1 * | 8/2013 | Prindle | H01L 21/823437 257/288 |

FOREIGN PATENT DOCUMENTS

| | | |
|---|---|---|
| KR | 1020060030720 | 4/2006 |
| KR | 1020120035312 | 4/2012 |

* cited by examiner

1200

1300

METHODS OF FABRICATING SEMICONDUCTOR DEVICES

CROSS-REFERENCE TO RELATED APPLICATION

This application claims priority under 35 U.S.C. 119 to Korean Patent Application No. 10-2014-0138276, filed on Oct. 14, 2014, in the Korean Intellectual Property Office, the disclosure of which is hereby incorporated by reference herein in its entirety.

BACKGROUND

1. Field of the Invention

The present inventive concept relates to a method of fabricating a semiconductor device.

2. Description of the Related Art

Recently, with the rapid proliferation of information media, functionality of a semiconductor device is drastically advancing. Recently proposed semiconductor products should be fabricated at low costs to achieve competitiveness and should be highly integrated to achieve high quality. To cope with the demand for highly integrated semiconductor devices, down-scaling of semiconductor devices has been progressed.

Research into methods for increasing the operating speed and integration density of semiconductor devices is under way. The semiconductor devices include discrete devices, such as a MOS transistor. According to the high integration of semiconductor devices, a gate of a MOS transistor is gradually shrinking, and a lower channel region of the gate gets narrower and narrower.

As a distance between a transistor and a gate is reduced, a distance between the gate of the transistor and a contact formed on a source/drain of the transistor is sharply reduced.

SUMMARY

The present inventive concept provides a method of fabricating a semiconductor device, which can improve the operating performance by reducing a change in the height of a replacement metal gate electrode of a gate.

The above and other objects of the present inventive concept will be described in or be apparent from the following description of example embodiments.

According to some embodiments of the present inventive concept, there is provided a method of fabricating a semiconductor device, the method including forming an interlayer insulation layer on a substrate, the interlayer insulation layer surrounding a dummy silicon gate and exposing a top surface of the dummy silicon gate, recessing a portion of the interlayer insulation layer and allowing a portion of the dummy silicon gate to protrude above a top surface of the recessed interlayer insulation layer, forming an etch stop layer on the recessed interlayer insulation layer, a top surface of the etch stop layer being coplanarly positioned with the top surface of the dummy silicon gate, and forming a trench exposing the substrate by removing the dummy silicon gate using the etch stop layer as a mask.

In some embodiments of the present inventive concept, the forming of the etch stop layer comprises forming a pre-etch stop layer including a first part formed on the top surface of the exposed dummy silicon gate and a second part formed on the top surface of the recessed interlayer insulation layer, and removing the first part of the pre-etch stop layer in a state in which the second part of the pre-etch stop layer is exposed.

In some embodiments of the present inventive concept, the first part of the pre-etch stop layer is removed by a chemical mechanical polishing (CMP) process.

In some embodiments of the present inventive concept, the forming of the etch stop layer comprises exposing the top surface of the dummy silicon gate.

In some embodiments of the present inventive concept, the forming of the interlayer insulation layer comprises allowing the top surface of the interlayer insulation layer and the top surface of the dummy silicon gate to be coplanarly positioned.

In some embodiments of the present inventive concept, the etch stop layer includes a material having etching selectivity to the interlayer insulation layer and the dummy silicon gate.

In some embodiments of the present inventive concept, the etch stop layer includes at least one of silicon nitride, silicon carbonitride, silicon carbide and silicon oxynitride.

In some embodiments of the present inventive concept, the method may further comprise forming a lower electrode layer along a top surface of the etch stop layer, and side surfaces and a bottom surface of the trench, forming an upper electrode layer on the lower electrode layer, the upper electrode layer filling the trench and covering a top surface of the interlayer insulation layer, and planarizing the lower electrode layer and the upper electrode layer to exposing the etch stop layer.

In some embodiments of the present inventive concept, the method may further comprise after the exposing of the etch stop layer, removing portions of the lower electrode layer and the upper electrode layer in the trench to form a recess, forming a capping layer filling the recess and covering the top surface of the etch stop layer, and forming a capping pattern in the trench by removing the capping layer on the top surface of the etch stop layer.

In some embodiments of the present inventive concept, a height ranging from a top surface of the substrate to a bottom surface of the recess is smaller than a height ranging from the top surface of the substrate to the top surface of the recessed interlayer insulation layer.

In some embodiments of the present inventive concept, the forming of the capping pattern comprises exposing the top surface of the recessed interlayer insulation layer by removing the etch stop layer.

According to some embodiments of the present inventive concept, there is provided a method of fabricating a semiconductor device, the method including forming an interlayer insulation layer on a substrate, the interlayer insulation layer covering a dummy silicon gate and a gate hard mask sequentially stacked, exposing the dummy silicon gate by removing the interlayer insulation layer and the gate hard mask on the dummy silicon gate, after the removing the gate hard mask, recessing a portion of the interlayer insulation layer to allow a portion of the dummy silicon gate to protrude above the top surface of a recessed interlayer insulation layer, forming a pre-etch stop layer on the top surface of the recessed interlayer insulation layer and the protruding dummy silicon gate, forming an etch stop layer exposing the dummy silicon gate on the recessed interlayer insulation layer by removing the pre-etch stop layer formed on the top surface of the dummy silicon gate using a CMP process, and forming a trench exposing the substrate by removing the exposed dummy silicon gate after the forming of the etch stop layer.

In some embodiments of the present inventive concept, the CMP process is performed using a slurry and is terminated when the slurry is brought into contact with the dummy silicon gate.

In some embodiments of the present inventive concept, the pre-etch stop layer includes a lower pre-etch stop layer and an upper pre-etch stop layer, the lower pre-etch stop layer is formed by atomic layer deposition, and the upper pre-etch stop layer is formed on the lower pre-etch stop layer by chemical vapor deposition.

In some embodiments of the present inventive concept, the method may further comprise forming a replacement metal gate electrode filling a portion of the trench, forming a capping pattern filling the trench on the replacement metal gate electrode, and forming a self-aligned contact positioned in the vicinity of the replacement metal gate electrode and penetrating the recessed interlayer insulation layer the trench.

In some embodiments of the present inventive concept, the removing of the interlayer insulation layer and the gate hard mask on the dummy silicon gate comprises planarizing the interlayer insulation layer using a CMP process to allow a top surface of the interlayer insulation layer and a top surface of the dummy silicon gate electrode to be coplanarly positioned.

According to some embodiments of the present inventive concept, there is provided a method of fabricating a semiconductor device, the method including forming a plurality of first dummy gate structures each including a first dummy silicon gate on a first region on a substrate, wherein a distance between each of the first dummy gate structures is a first distance, forming a plurality of second dummy gate structures each including a second dummy silicon gate on a second region on the substrate, wherein a distance between each of the second dummy gate structures is a second distance greater than the first distance, forming an interlayer insulation layer on the substrate, the interlayer insulation layer surrounding the first dummy silicon gate and the second dummy silicon gate and exposing a top surface of the first dummy silicon gate and a top surface of the second dummy silicon gate, recessing a portion of the interlayer insulation layer to allow the first dummy silicon gate and the second dummy silicon gate to protrude above a top surface of the recessed interlayer insulation layer, forming a pre-etch stop layer on the top surface of the interlayer insulation layer and the protruding first and second dummy silicon gates, wherein a height ranging from a top surface of the substrate to the bottommost part of the top surface of the pre-etch stop layer of the second region is greater than a height ranging from the top surface of the substrate to the top surface of the second dummy silicon gate, and removing the pre-etch stop layer on the first and second dummy silicon gates using a CMP process to form an etch stop layer on the recessed interlayer insulation layer, wherein a top surface of the etch stop layer in the first region and a top surface of the etch stop layer in the second region are coplanar positioned.

In some embodiments of the present inventive concept, the forming of the etch stop layer comprises coplanarly positioning the top surface of the first dummy silicon gate, the top surface of the second dummy silicon gate and the top surface of the etch stop layer.

In some embodiments of the present inventive concept, the CMP process is performed in a state in which a top surface of the pre-etch stop layer between the first dummy gate structures and a top surface of the pre-etch stop layer between the second dummy gate structures.

In some embodiments of the present inventive concept, the method may further comprise after the forming of the etch stop layer, removing the exposed first dummy silicon gate and the exposed second dummy silicon gate to form a first trench and a second trench exposing the substrate, and forming a first replacement metal gate electrode and a second replacement metal gate electrode respectively filling at least portions of the first trench and second trench.

BRIEF DESCRIPTION OF THE DRAWINGS

The above and other features and advantages of the present inventive concept will become more apparent by describing in detail example embodiments thereof with reference to the attached drawings in which.

DETAILED DESCRIPTION OF THE EMBODIMENTS

Figure 1:
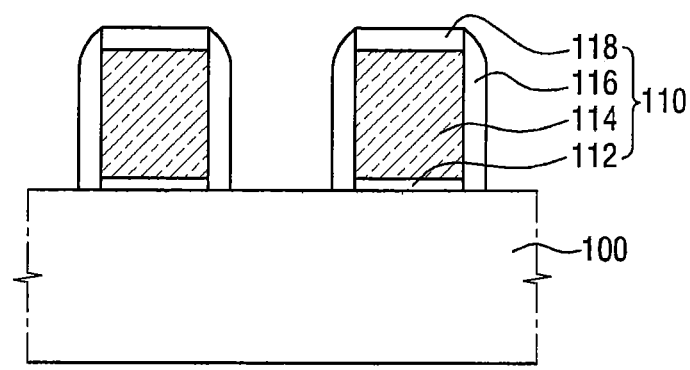
FIGS. 1 to 12 illustrate intermediate process steps in a method of fabricating a semiconductor device according to some embodiments of the present inventive concept.

The present inventive concept will now be described more fully hereinafter with reference to the accompanying drawings, in which example embodiments of the invention are shown. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing some embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the present inventive concept belongs. It is noted that the use of any and all examples, or terms provided herein is intended merely to better illuminate the present inventive concept and is not a limitation on the scope of the inventive concept unless otherwise specified. Further, unless defined otherwise, all terms defined in generally used dictionaries may not be overly interpreted.

Hereinafter, a method of fabricating a semiconductor device according to an embodiment of the present inventive concept will be described with reference to FIGS. 1 to 12.

FIGS. 1 to 12 illustrate intermediate process steps in a method of fabricating a semiconductor device according to an embodiment of the present inventive concept.

Referring to FIG. 1, a first dummy gate structure 110 may be formed on a substrate 100.

The first dummy gate structure 110 may include a first dummy gate insulation layer 112, a first dummy gate electrode 114, a first gate spacer 116, and a first gate hard mask 118.

For example, an insulation layer, an electrode layer and a hard mask layer may be sequentially formed on the substrate 100. A mask pattern for forming a first dummy gate structure 110 is formed on the hard mask layer. A first dummy gate insulation layer 112, a first dummy gate electrode 114 and a first gate hard mask 118 may be formed on the substrate 100 by performing an etching process using the mask pattern as a mask.

Thereafter, a spacer layer covering the first dummy gate insulation layer 112, the first dummy gate electrode 114 and the first gate hard mask 118 sequentially stacked on the substrate 100 may be formed. The spacer layer may be directionally etched, thereby forming a first gate spacer 116 on sidewalls of the first dummy gate electrode 114. Accordingly, the first dummy gate structure 110 may be formed on the substrate 100.

In detail, the substrate 100 may be bulk silicon or a silicon-on-insulator (SOI). Alternatively, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and gallium antimonide, but aspects of the present disclosure are not limited thereto.

In addition, the substrate 100 may include a fin type active pattern. When the substrate 100 includes a fin type active pattern, the fin type active pattern may include, for example, an element semiconductor material, such as silicon or germanium. In addition, the fin type active pattern may include a compound semiconductor and examples thereof may include, for example, a IV-IV group compound semiconductor or a III-V group compound semiconductor.

The IV-IV group compound semiconductor may include, for example, a binary compound or a ternary compound including at least two elements of carbon (C), silicon (Si), germanium (Ge), and tin (Sn) or a compound doped with a IV group element.

The III-V group compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In FIG. 1, when the substrate 100 includes a fin type active pattern, the first dummy gate structure 110 may be formed on the fin type active pattern, but aspects of the present disclosure are not limited thereto.

The first dummy gate insulation layer 112 may include, for example, silicon oxide, silicon oxynitride and a combination thereof. The first dummy gate insulation layer 112 may be formed by, for example, thermal treatment, chemical treatment, atomic layer deposition (ALD) or chemical vapor deposition (CVD).

The first dummy gate electrode 114 may include, for example, silicon, specifically, one of polycrystalline silicon (poly Si), amorphous silicon (a-Si) and a combination thereof. The first dummy gate electrode 114 may be undoped or doped with impurity. The poly Si may be formed by, for example, CVD and the a-Si may be formed by, for example, sputtering, CVD, or plasma deposition, but aspects of the present disclosure are not limited thereto.

The first gate hard mask 118 may include, for example, nitride, oxide and combination thereof. The first gate hard mask 118 may be formed by, for example, CVD.

The first gate spacer 116 may include, for example, silicon nitride, silicon oxynitride, silicon oxide and silicon carbon oxynitride (SiOCN). The first gate spacer 116 may be formed by, for example, CVD. The first gate spacer 116 may be formed of a single layer as illustrated in FIG. 1 but aspects of the present disclosure are not limited thereto. In some embodiments, the first gate spacer 116 may be formed of multiple layers.

After forming the first gate spacer 116, a source/drain region may be formed at opposite sides of the first dummy gate electrode 114.

Figure 2:
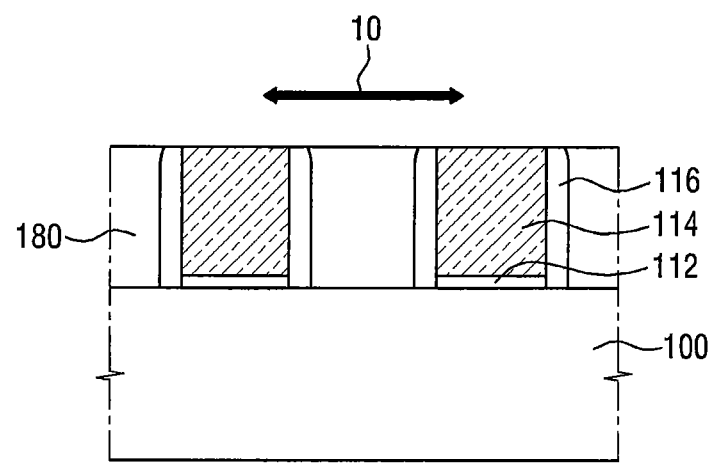

Referring to FIG. 2, a first interlayer insulation layer 180 is formed on the substrate 100, the first interlayer insulation layer 180 covering the first dummy gate structure 110 including the first dummy gate insulation layer 112, the first dummy gate electrode 114 and the first gate hard mask 118 sequentially stacked.

The first interlayer insulation layer 180 may include, for example, at least one of a low-k material, an oxide layer, a nitride layer, and an oxynitride layer. The low-k material may include, for example, flowable oxide (FOX), tonen silazene (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and combinations thereof, but aspects of the present disclosure are not limited thereto.

The first interlayer insulation layer 180 may be planarized using a first planarization process 10. As the result, a top surface of the first dummy gate electrode 114 is exposed. The first planarization process 10 may be, for example, a chemical mechanical polishing (CMP) process.

The first interlayer insulation layer 180 may be formed on the substrate 100, the first interlayer insulation layer 180 surrounding the first dummy gate electrode 114 and exposing the top surface of the first dummy gate electrode 114. In addition, the top surface of the first interlayer insulation layer 180 and the top surface of the first dummy gate electrode 114 may be coplanarly positioned.

The first interlayer insulation layer 180 exposing the top surface of the first dummy gate electrode 114 may be formed by removing the first interlayer insulation layer 180 and the first gate hard mask 118 on the top surface of the first dummy gate electrode 114.

The top surface of the first dummy gate electrode 114 may be exposed by removing the first interlayer insulation layer 180 and the first gate hard mask 118 on the top surface of the first dummy gate electrode 114 using, for example, the first planarization process 10.

Alternatively, the first gate hard mask 118 may be exposed by removing a portion of the first interlayer insulation layer 180 covering the first dummy gate structure (110 of FIG. 1). Next, the first dummy gate electrode 114 may be exposed by removing the first gate hard mask 118. Here, there is a step difference between the top surface of the first interlayer insulation layer 180 and the top surface of the first dummy gate electrode 114.

Next, the first interlayer insulation layer 180 protruding above the top surface of the first dummy gate electrode 114 is removed using a first planarization process 10, thereby allowing the top surface of the first interlayer insulation layer 180 and the top surface of the first dummy gate electrode 114 to be coplanarly positioned.

Figure 3:
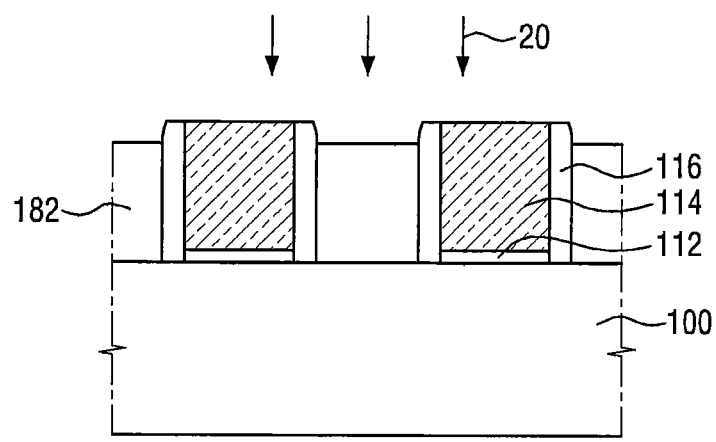

Referring to FIG. 3, a portion of the first interlayer insulation layer 180 is recessed using a first etching process 20, thereby forming a first recessed interlayer insulation layer 182.

As the result, the portion of the first dummy gate electrode 114 may protrude above the top surface of the first recessed interlayer insulation layer 182. That is to say, a height ranging from the top surface of the substrate 100 to the top surface of the first dummy gate electrode 114 may be greater than a height ranging from the top surface of the substrate 100 to the top surface of the first recessed interlayer insulation layer 182.

While the portion of the first dummy gate electrode 114 protrudes, a portion of the first gate spacer 116 may also protrude above the top surface of the first recessed interlayer insulation layer 182.

The recessing of the portion of the first interlayer insulation layer 180 may be performed using a material having a sufficient etching selectivity with respect to the first gate spacer 116 and the first dummy gate electrode 114.

When the first interlayer insulation layer 180 includes, for example, silicon oxide, the recessing of the portion of the first interlayer insulation layer 180 may be performed using a chemical oxide removal (COR) process, but aspects of the present disclosure are not limited thereto.

Figure 4:
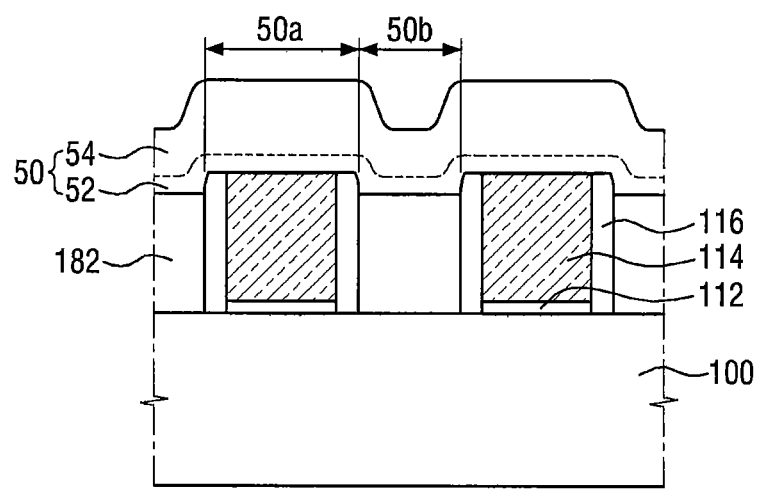

Referring to FIG. 4, a pre-etch stop layer 50 is formed on the top surface of the first recessed interlayer insulation layer 182. In addition, the pre-etch stop layer 50 is also formed on the top surface of the first dummy gate electrode 114 protruding above the top surface of the first recessed interlayer insulation layer 182.

The pre-etch stop layer 50 may be formed along the first dummy gate electrode 114 and the top surface of the first recessed interlayer insulation layer 182 as illustrated in FIG. 4.

The pre-etch stop layer 50 may include a material having an etching selectivity with respect to the first dummy gate electrode 114. In addition, the pre-etch stop layer 50 may include a material having an etching selectivity with respect to the first recessed interlayer insulation layer 182.

The pre-etch stop layer 50 may include, for example, a compound including at least one element selected from the group consisting of carbon (C), nitrogen (N) and oxygen (O), and silicon (Si). In more detail, the pre-etch stop layer 50 may include, for example, at least one selected from the group consisting of silicon nitride (SiN), silicon carbide (SiC), silicon carbonitride (SiCN) and silicon oxynitride (SiON).

In addition, the pre-etch stop layer 50 may be a single composition layer including a material having the same composition ratio as a whole. Alternatively, the pre-etch stop layer 50 may be a grading layer having material compositions varying in a thickness direction of the substrate 100.

When the pre-etch stop layer 50 is a grading layer, the pre-etch stop layer 50 adjacent to the first recessed interlayer insulation layer 182 may have an etching selectivity with respect to the first recessed interlayer insulation layer 182. In addition, part of the pre-etch stop layer 50 spaced apart from the first recessed interlayer insulation layer 182, that is, a top surface part of the pre-etch stop layer 50 may have an etching resistance material.

The pre-etch stop layer 50 may be formed by, for example, ALD or CVD.

The pre-etch stop layer 50 may include a first part 50a and a second part 50b. The first part 50a of the pre-etch stop layer 50 may be a part formed on the top surface of the first dummy gate electrode 114 and the second part 50b of the pre-etch stop layer 50 may be a part formed on the top surface of the first recessed interlayer insulation layer 182.

In view of the top surface of the substrate 100, a top surface of the first part 50a of the pre-etch stop layer 50 may be higher than a top surface of the second part 50b of the pre-etch stop layer 50. In addition, as will later be described with reference to FIG. 16, in view of the top surface of the substrate 100, the top surface of the second part 50b of the pre-etch stop layer 50 may be higher than the top surface of the first dummy gate electrode 114.

In addition, the pre-etch stop layer 50 may include a lower pre-etch stop layer 52 and an upper pre-etch stop layer 54. The lower pre-etch stop layer 52 may be conformally formed along the top surface of the first dummy gate electrode 114 and the top surface of the first recessed interlayer insulation layer 182. The upper pre-etch stop layer 54 may be formed on the lower pre-etch stop layer 52 along the top surface of the lower pre-etch stop layer 52.

For example, a process of forming the lower pre-etch stop layer 52 and a process of forming the upper pre-etch stop layer 54 may be different from each other. The lower pre-etch stop layer 52 may be formed by, for example, ALD. The upper pre-etch stop layer 54 may be formed by CVD, but aspects of the present disclosure are not limited thereto.

In other words, in the method of fabricating the semiconductor device according to an embodiment of the present inventive concept, the lower pre-etch stop layer 52 and the upper pre-etch stop layer 54 of the pre-etch stop layer 50 may be formed by different deposition methods but may also be formed by the same deposition method.

Figure 5:
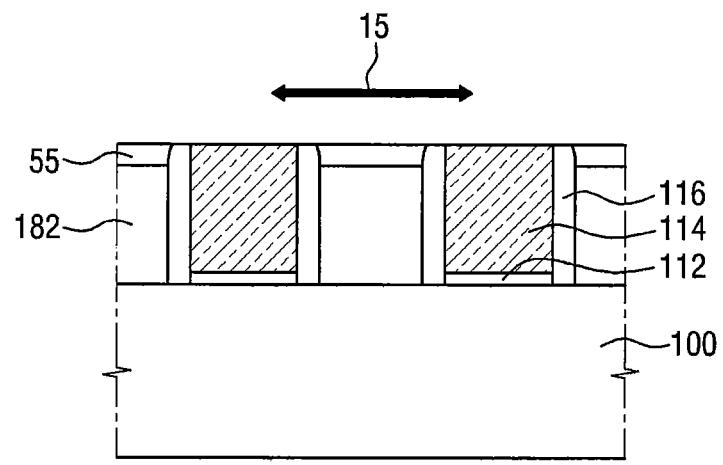

Referring to FIG. 5, the pre-etch stop layer 50 on the top surface of the first dummy gate electrode 114 may be removed by a second planarization process 15. As the result, an etch stop layer 55 exposing the top surface of the first dummy gate electrode 114 may be formed on the first recessed interlayer insulation layer 182.

In detail, the etch stop layer 55 may be formed on the top surface of the first recessed interlayer insulation layer 182. That is to say, the etch stop layer 55 may be formed to fill the recessed portion of the first interlayer insulation layer 180 shown in FIG. 2.

In other words, the etch stop layer 55 may be formed on the first recessed interlayer insulation layer 182 by removing the first part 50a of the pre-etch stop layer 50. The first part 50a of the pre-etch stop layer 50 may be formed using the second planarization process 15.

Therefore, when the etch stop layer 55 is formed, a top surface of the etch stop layer 55 and a top surface of the first dummy gate electrode 114 may be coplanarly positioned.

The second planarization process 15 may be, for example, a chemical mechanical polishing (CMP) process. The second planarization process 15 may employ slurry in which the CMP is practically interrupted when it is brought into contact with silicon (Si). In other words, the second planarization process 15 may employ slurry in which a polishing process is practically interrupted when it is brought into contact with the first dummy gate electrode 114. The expression "a polishing process is practically interrupted" used herein may mean that once the top surface of the first dummy gate electrode 114 is exposed, the first dummy gate electrode 114 is no longer polished.

When the pre-etch stop layer 50 includes, for example, silicon nitride, the slurry used in the second planarization process 15 may be a Si-stop silicon nitride slurry.

Additionally, when the second planarization process 15 for forming the etch stop layer 55 is performed, there may be no layer formed on the top surface of the pre-etch stop layer 50. That is to say, the second planarization process 15 is performed in a state in which the top surface of the pre-etch stop layer 50 is exposed, thereby forming the etch stop layer 55 on the top surface of the first recessed interlayer insulation layer 182. The second planarization process 15 may be performed in a state in which the second part 50b of the pre-etch stop layer 50 is exposed, thereby removing the first part 50a of the pre-etch stop layer 50.

Figure 6:
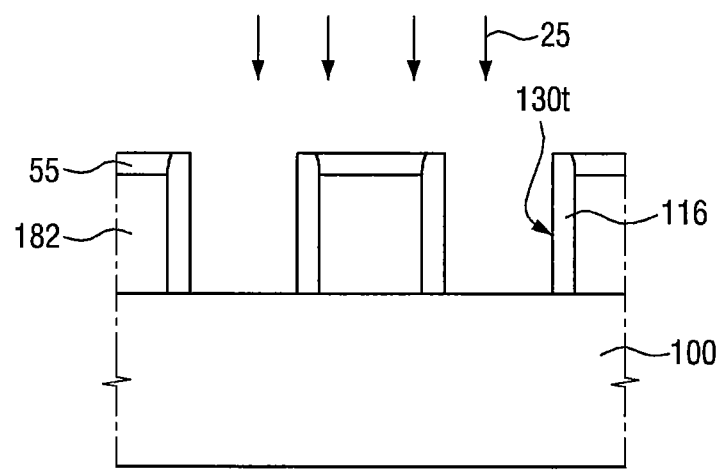

Referring to FIG. 6, the first dummy gate electrode 114 and the first dummy gate insulation layer 112 may be removed using the etch stop layer 55 as a mask. The first dummy gate electrode 114 and the first dummy gate insulation layer 112 may be removed by a second etching process 25.

As the result of removing the first dummy gate electrode 114 and the first dummy gate insulation layer 112, a first trench 130t exposing the top surface of the substrate 100 may be formed.

The second etching process 25 may include, for example, a dry etching process, a wet etching process or a combination thereof.

The first dummy gate electrode 114 may be removed by, for example, an etch-back process. Alternatively, the first dummy gate electrode 114 may be substantially removed by exposing an aqueous solution containing a hydroxide source at a sufficiently high temperature for a sufficiently long time. The hydroxide source may include, for example, ammonium hydroxide or tetraalkyl ammonium hydroxide, such as tetramethyl ammonium hydroxide (TMAH), but aspects of the present disclosure are not limited thereto.

Figure 7:
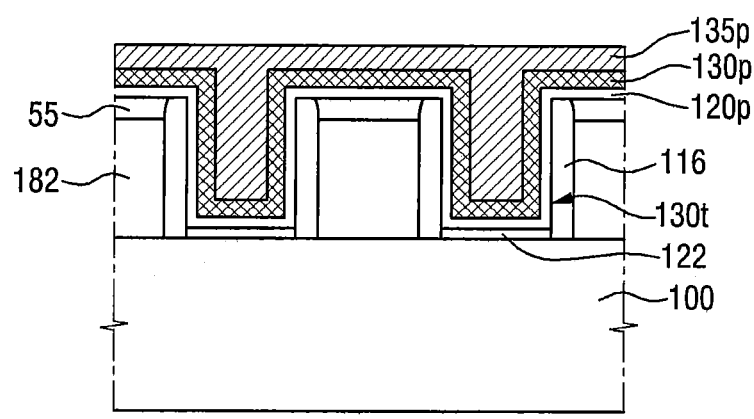

Referring to FIG. 7, a first interfacial layer 122 may be formed on a bottom surface of the first trench 130t.

The first interfacial layer 122 may include silicon oxide. The first interfacial layer 122 may be formed by, for example, chemical oxidation, UV oxidation or dual plasma oxidation.

Next, a first insulation layer 120p and a first lower electrode layer 130p may be sequentially formed along the top surface of the etch stop layer 55 and sidewalls and the bottom surface of the first trench 130t. The first insulation layer 120p may be formed on the first interfacial layer 122 formed on the bottom surface of the first trench 130t.

A first upper electrode layer 135p may be formed on the first lower electrode layer 130p, the first upper electrode layer 135p filling the first trench 130t and covering the top surface of the etch stop layer 55.

The first insulation layer 120p may include a high-k material having a higher dielectric constant than a silicon oxide layer. The high-k material may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of the present disclosure are not limited thereto.

The first lower electrode layer 130p may include, for example, an n type work function control layer, or a stack of a p type work function control layer and an n type work function control layer, but aspects of the present disclosure are not limited thereto.

The p type work function control layer may include, for example, at least one of TiN, WN, TaN, Ru and combinations thereof, but aspects of the present disclosure are not limited thereto. The n type work function control layer may include, for example, at least one of Ti, Ag, Al, TiAl, TiAlN, TiAlC, TaC, TaCN, TaSiN, Mn, Zr and combinations thereof, but aspects of the present disclosure are not limited thereto.

The first upper electrode layer 135p may include, for example, tungsten (W), aluminum (Al), and cobalt (Co), but aspects of the present disclosure are not limited thereto.

Figure 8:
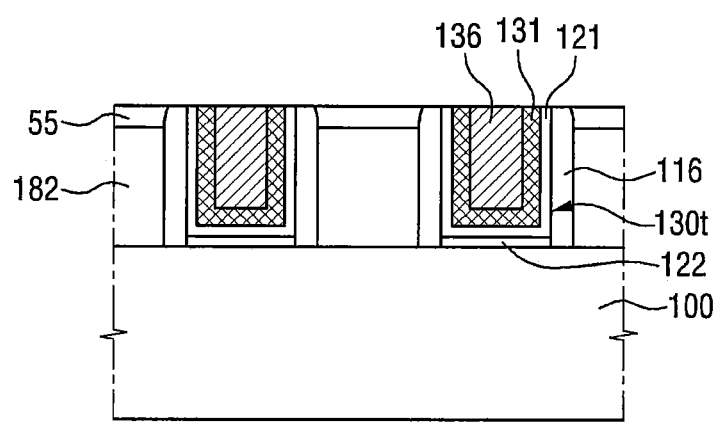

Referring to FIG. 8, the first insulation layer 120p, the first lower electrode layer 130p and the first upper electrode layer 135p are planarized to expose the etch stop layer 55.

In more detail, the first insulation layer 120p, the first lower electrode layer 130p and the first upper electrode layer 135p may be planarized until the top surface of the etch stop layer 55 is exposed.

As the result, a first high-k insulation layer 121, a first lower gate electrode 131 and a first upper gate electrode 136 may be formed in the first trench 130t.

The first lower gate electrode 131 and the first upper gate electrode 136 may be replacement metal gate electrodes.

Figure 12:
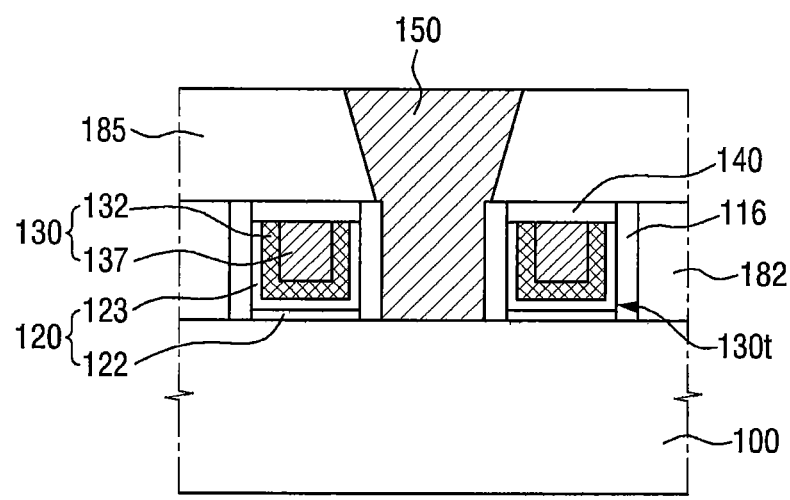

Through processes having performed heretofore, the first lower gate electrode 131 and the first upper gate electrode 136 are formed in the first trench 130t and a second interlayer insulation layer 185 shown in FIG. 12 is formed, thereby forming a gate terminal portion of a transistor.

However, the method of fabricating the semiconductor device according to an embodiment of the present inventive concept may further include additionally forming a self aligned contact (SAC), which will further be described.

Figure 9:
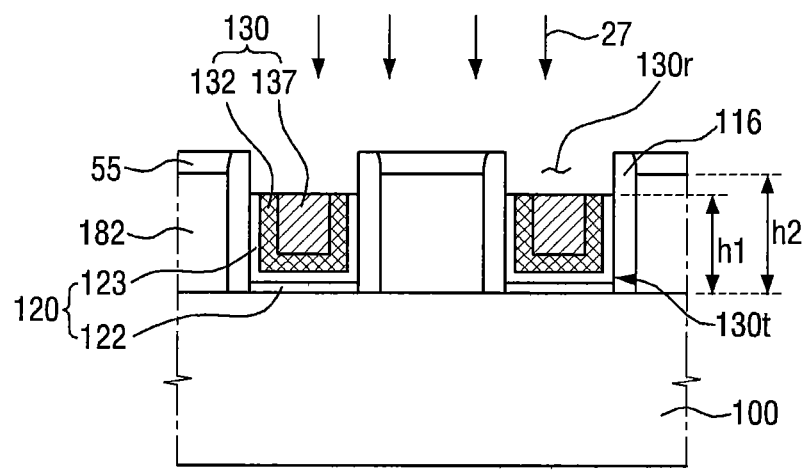

Referring to FIG. 9, portions of the first high-k insulation layer 121, the first lower gate electrode 131 and the first upper gate electrode 136 may be removed, thereby forming a recess 130r. The recess 130r may be formed using a third etching process 27. The portions of the first high-k insulation layer 121, the first lower gate electrode 131 and the first upper gate electrode 136 may be removed by the third etching process 27.

A bottom surface of the recess 130r may include a first recessed high-k insulation layer 123, a first recessed lower gate electrode 132 and a first recessed upper gate electrode 137. Sidewalls of the recess 130r may include a first gate spacer 116.

In FIG. 9, a height ranging from the top surface of the substrate 100 to the bottom surface of the recess 130r may be a first height h1 and a height ranging from the top surface of the substrate 100 to the top surface of the first recessed interlayer insulation layer 182 may be a second height h2. Here, the second height h2 may be greater than the first height h1.

That is to say, the top surface of the first recessed interlayer insulation layer 182 may be spaced apart from the top surface of the substrate 100 farther than from the bottom surface of the recess 130r.

In other words, the top surface of the first recessed interlayer insulation layer 182 may protrude above the bottom surface of the recess 130r.

As the result, a first gate insulation layer 120 including the first interfacial layer 122 and the first recessed high-k insulation layer 123 may be formed in the first trench 130t, and a first gate electrode 130 including the first recessed lower gate electrode 132 and the first recessed upper gate electrode 137 may be formed in the first trench 130t.

Figure 10:
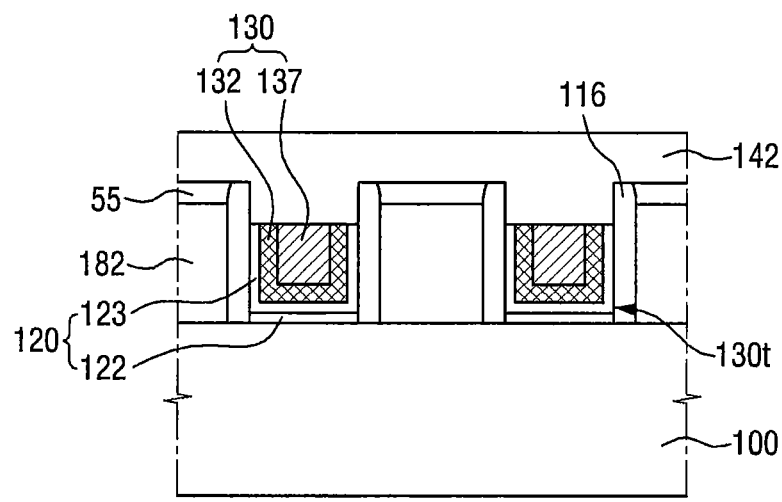

Referring to FIG. 10, a first capping layer 142 filling the recess 130r and covering the top surface of the etch stop layer 55 may be formed.

The first capping layer 142 may include, for example, at least one of silicon nitride (SiN), silicon oxynitride (SiON), silicon oxide ($SiO_2$), silicon carbonitride (SiCN), silicon carbon oxynitride (SiOCN) and combinations thereof.

Figure 11:
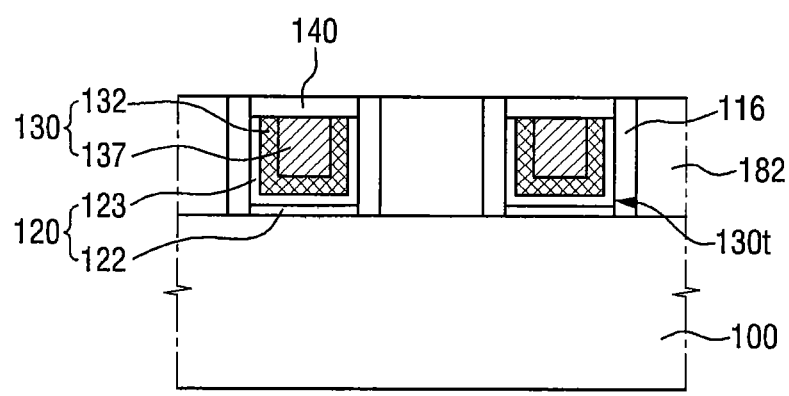

Referring to FIG. 11, the etch stop layer 55 and the first capping layer 142 formed on the top surface of the etch stop layer 55 may be removed to expose the top surface of the first recessed interlayer insulation layer 182.

The first capping layer 142 and the etch stop layer 55 may be removed by, for example, a planarization process, but aspects of the present disclosure are not limited thereto.

As the result, a first capping pattern 140 filling the first trench 130t may be formed. In more detail, the first capping pattern 140 may fill a portion of the first trench 130t.

The first capping pattern 140 may be formed on the first gate insulation layer 120 and the first gate electrode 130 filling the portion of the first trench 130t. The first capping pattern 140 may fill a portion remaining after forming the first gate insulation layer 120 and the first gate electrode 130.

Referring to FIG. 12, a second interlayer insulation layer 185 covering the first capping pattern 140 and the first recessed interlayer insulation layer 182 may be formed.

The second interlayer insulation layer 185 may include, for example, at least one of a low-k material, oxide, nitride and oxynitride.

Next, a self aligned contact (SAC) 150 adjacent to the first gate electrode 130 that is a replacement metal gate electrode may be formed. The SAC 150 may be formed while passing through the second interlayer insulation layer 185 and the first recessed interlayer insulation layer 182.

The SAC 150 may include, for example, tungsten (W), aluminum (Al), or cobalt (Co), but aspects of the present disclosure are not limited thereto.

A method of fabricating a semiconductor device according to another embodiment of the present inventive concept will now be described with reference to FIGS. 13 to 19. For the sake of convenient explanation, the same content as described above with reference to FIGS. 1 to 12 will be omitted or will be briefly described.

FIGS. 13 to 19 illustrate intermediate process steps in a method of fabricating a semiconductor device according to another embodiment of the present inventive concept.

Figure 13:
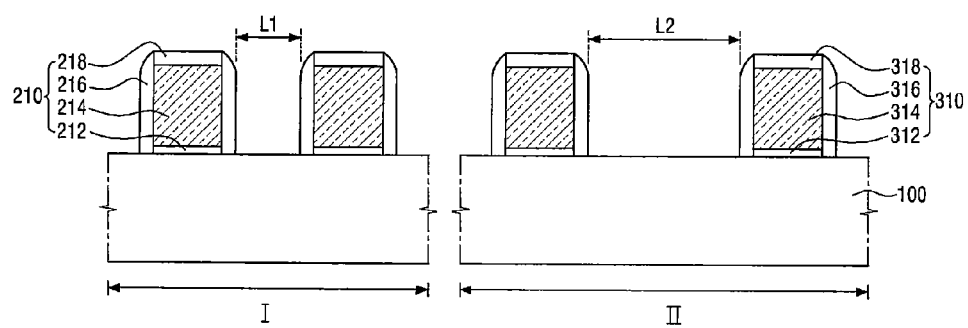
FIGS. 13 to 19 illustrate intermediate process steps in a method of fabricating a semiconductor device according to some embodiments of the present inventive concept.

Referring to FIG. 13, a plurality of second dummy gate structures 210 may be formed on a first region I of the substrate 100 and a plurality of third dummy gate structures 310 may be formed on a second region II of the substrate 100.

The first region I and the second region II may be spaced apart from each other or may be connected to each other. In addition, the first region I and the second region II may be PMOS forming regions or NMOS forming regions. Alternatively, one of the first region I and the second region II may be a PMOS forming region and the other may be an NMOS forming region.

Each of the second dummy gate structures 210 may include a second dummy gate insulation layer 212, a second dummy gate electrode 214, a second gate spacer 216 and a second gate hard mask 218. The second dummy gate insulation layer 212, the second dummy gate electrode 214 and the second gate hard mask 218 may be sequentially formed on the first region I of the substrate 100.

Each of the third dummy gate structures 310 may include a third dummy gate insulation layer 312, a third dummy gate electrode 314, a third gate spacer 316 and a third gate hard mask 318. The third dummy gate insulation layer 312, the third dummy gate electrode 314 and the third gate hard mask 318 may be sequentially formed on the second region II of the substrate 100.

Since a description of the second dummy gate structures 210 and the third dummy gate structures 310 is substantially the same as that of the first dummy gate structure 110 shown in FIG. 1, a repeated description thereof will not be given.

In FIG. 13, a distance between the second dummy gate structures 210 adjacent to each other may be a first distance L1 and a distance between the third dummy gate structures 310 adjacent to each other may be a second distance L2. The first distance L1 between the second dummy gate structures 210 adjacent to each other may be defined as a distance between outer sidewalls of second gate spacers 216 adjacent to each other.

In the method of fabricating the semiconductor device according to another embodiment of the present inventive concept, the first distance L1 between the second dummy gate structures 210 adjacent to each other may be smaller than the second distance L2 between the third dummy gate structures 310 adjacent to each other.

Figure 14:
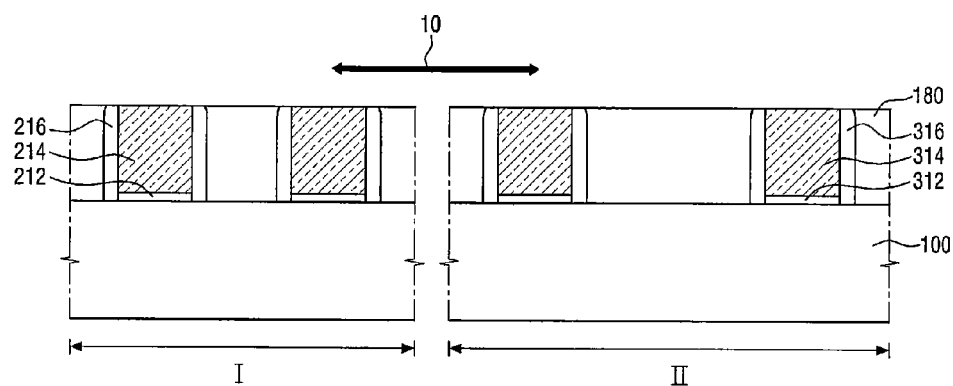

Referring to FIG. 14, a first interlayer insulation layer 180 covering the second dummy gate structures 210 and the third dummy gate structures 310 is formed on the substrate 100.

Next, the first interlayer insulation layer 180 is planarized using a first planarization process 10. As the result, a top surface of the second dummy gate electrode 214 and a top surface of the third dummy gate electrode 314 are exposed.

A first interlayer insulation layer 180 may be formed on the substrate 100, the first interlayer insulation layer 180 surrounding the second dummy gate electrode 214 and the third dummy gate electrode 314 and exposing the top surface of the second dummy gate electrode 214 and the top surface of the third dummy gate electrode 314.

In addition, the top surface of the first interlayer insulation layer 180, the top surface of the second dummy gate electrode 214 and the top surface of the third dummy gate electrode 314 may be coplanarly positioned.

Figure 15:
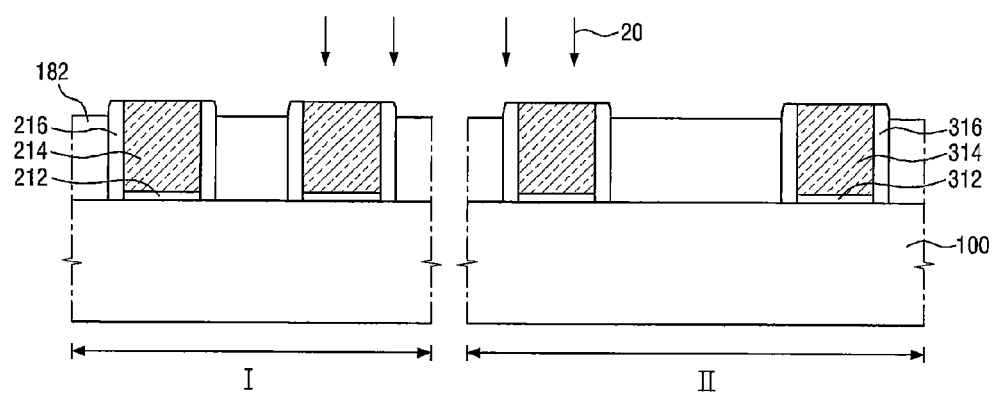

Referring to FIG. 15, a portion of the first interlayer insulation layer 180 is recessed using a first etching process 20, thereby forming a first recessed interlayer insulation layer 182.

A portion of the second dummy gate electrode 214 and a portion of the third dummy gate electrode 314 may protrude above a top surface of the first recessed interlayer insulation layer 182.

While the portion of second dummy gate electrode 214 and the portion of the third dummy gate electrode 314 protrude, a portion of the second gate spacer 216 and a portion of the third gate spacer 316 may also protrude above the top surface of the first recessed interlayer insulation layer 182.

Figure 16:
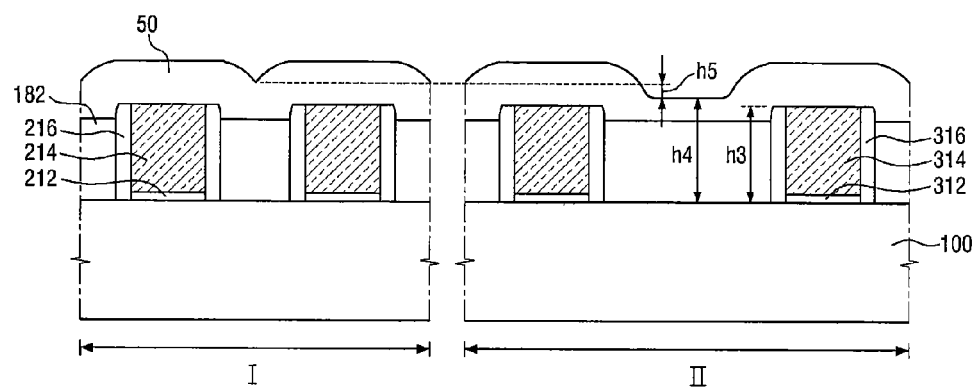

Referring to FIG. 16, a pre-etch stop layer 50 is formed on the top surface of the first recessed interlayer insulation layer 182. In addition, the pre-etch stop layer 50 may also be formed on the top surface of the second dummy gate electrode 214 and the top surface of the third dummy gate electrode 314 protruding above the top surface of the first recessed interlayer insulation layer 182.

The pre-etch stop layer 50 may be formed along the second dummy gate electrode 214, the third dummy gate electrode 314 and the top surface of the first recessed interlayer insulation layer 182.

The pre-etch stop layer 50 may include a material having an etching selectivity with respect to the second dummy gate electrode 214 and the third dummy gate electrode 314.

In FIG. 16, in a second region II of the substrate 100, a height h4 ranging from the top surface of the substrate 100 to a bottommost part of a top surface of the pre-etch stop layer 50 may be greater than a height h3 ranging from the top surface of the substrate 100 to a top surface of the third dummy gate electrode 314. Since in view of the top surface of the substrate 100, the height h4 ranging from the top surface of the substrate 100 to the bottommost part of the top surface of the pre-etch stop layer 50 is greater than the height h3 ranging from the top surface of the substrate 100 to the top surface of the third dummy gate electrode 314, the top surface of the etch stop layer 55 and the top surface of the third dummy gate electrode 314 may be coplanarly positioned in a second planarization process to later be performed.

In FIG. 16, in a first region I of the substrate 100, a height (h4+h5) ranging from the top surface of the substrate 100 to the bottommost part of the top surface of the pre-etch stop layer 50 may be greater than the height h4 ranging from the top surface of the substrate 100 to the bottommost part of the top surface of the pre-etch stop layer 50 in the second region II of the substrate 100. Since a distance between second gate spacers 216 adjacent to each other in the first region I is smaller than a distance between third gate spacers 316 adjacent to each other in the second region II, there may be a height difference.

Figure 17:
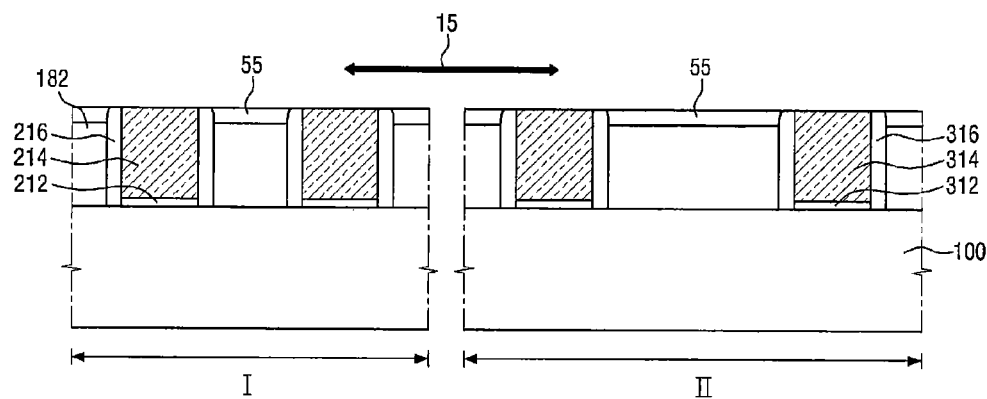

Referring to FIG. 17, the pre-etch stop layer 50 on the top surface of second dummy gate electrode 214 and the top surface of the third dummy gate electrode 314 may be removed using a second planarization process 15.

The etch stop layer 55 exposing the top surface of the second dummy gate electrode 214 and the top surface of the third dummy gate electrode 314 may be formed on the first recessed interlayer insulation layer 182.

As the result, when the etch stop layer 55 is formed, the top surface of the etch stop layer 55, the top surface of the second dummy gate electrode 214 and the top surface of the third dummy gate electrode 314 may be coplanarly positioned. That is to say, the top surface of the etch stop layer 55 on the first region I and the top surface of the etch stop layer 55 on the second region II may be coplanarly positioned.

Additionally, when the second planarization process 15 for forming the etch stop layer 55 is performed, there may be no layer formed on the top surface of the pre-etch stop layer 50. That is to say, the second planarization process 15 is performed in a state in which the top surface of the pre-etch stop layer 50 is exposed, thereby forming the etch stop layer 55 on the top surface of the first recessed interlayer insulation layer 182.

Figure 18:
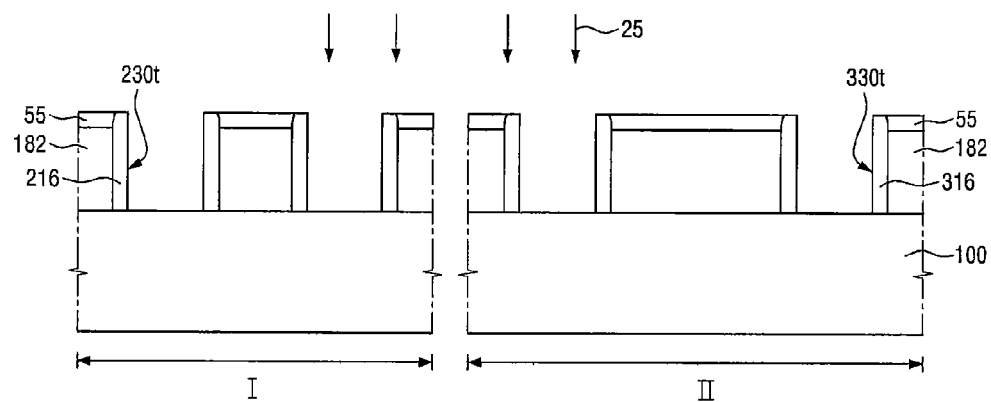

Referring to FIG. 18, a second etching process 25 is performed using the etch stop layer 55 as a mask, thereby removing the second dummy gate electrode 214, the third dummy gate electrode 314, the second dummy gate insulation layer 212 and the third dummy gate insulation layer 312.

As the result, a second trench 230t exposing the top surface of the substrate may be formed on the first region I of the substrate 100 and a third trench 330t exposing the top surface of the substrate 100 in the second region II of the substrate 100.

Figure 19:
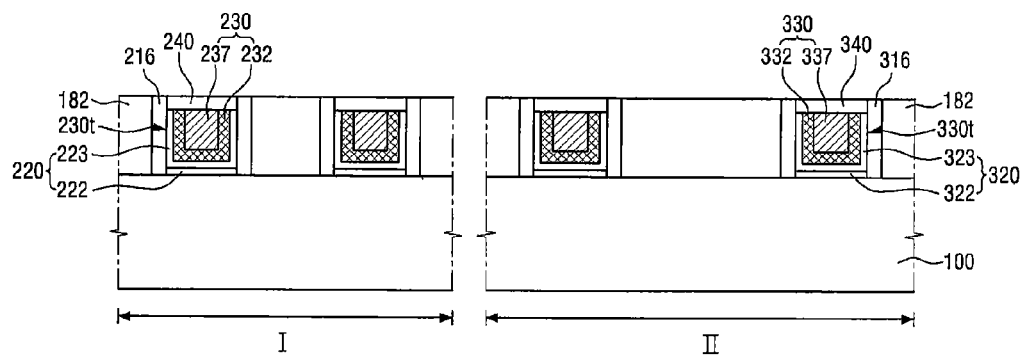

Referring to FIG. 19, a second gate insulation layer 220 including a second interfacial layer 222 and a second recessed high-k insulating layer 223 is formed in first region I of the substrate 100.

A second gate electrode 230 including a second recessed lower gate electrode 232 and a second recessed upper gate electrode 237 is formed on the second gate insulation layer 220. The second gate electrode 230 may fill at least a portion of the second trench 230t. The second gate electrode 230 may be a replacement metal gate electrode.

A second capping pattern 240 filling the second trench 230t is formed on the second gate insulation layer 220 and the second gate electrode 230.

Likewise, a third gate insulation layer 320 including a third interfacial layer 322 and a third recessed high-k insulating layer 323 is formed in the second region II of the substrate 100.

A third gate electrode 330 including a third recessed lower gate electrode 332 and a third recessed upper gate electrode 337 is formed on the third gate insulation layer 320. The third gate electrode 330 may fill at least a portion of the third trench 330t. The third gate electrode 330 may fill a replacement metal gate electrode.

A third capping pattern 340 filling the third trench 330t is formed on the third gate insulation layer 320 and the third gate electrode 330.

Since a description of the second gate insulation layer 220, the third gate insulation layer 320, the second gate electrode 230, the third gate electrode 330, the second capping pattern 240 and the third capping pattern 340 is substantially the same as described above with reference to FIGS. 7 to 11, a repeated description thereof will not be given.

Next, an example electronic system using the semiconductor device fabricated by a semiconductor device fabricating method shown in FIGS. 1 to 19.

Figure 20:
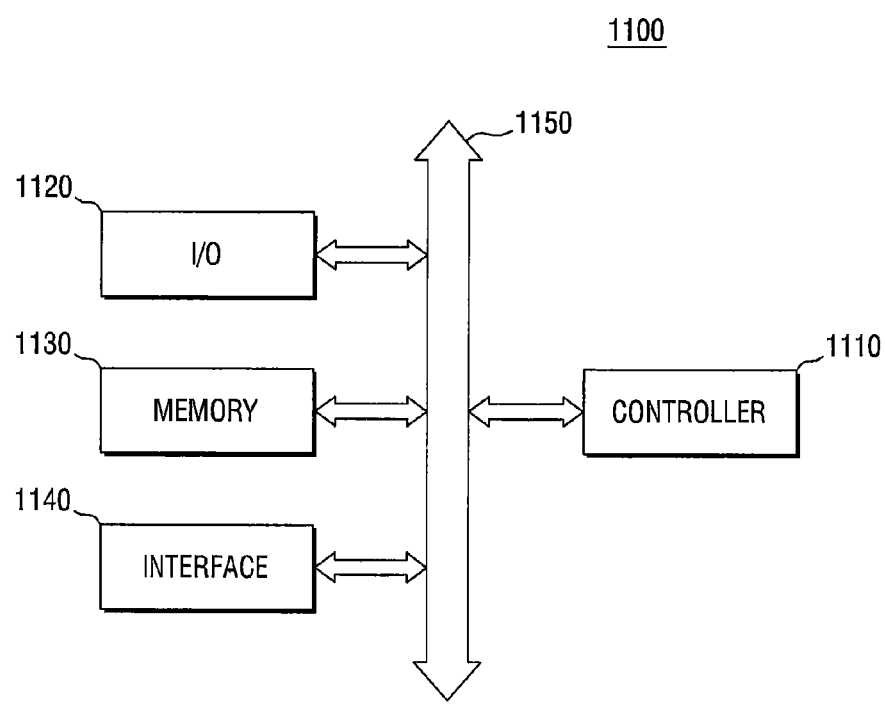
FIG. 20 is a block diagram of an electronic system including a semiconductor device fabricated by a method according to some embodiments of the present inventive concept.

FIG. 20 is a block diagram of an electronic system including a semiconductor device fabricated by a semiconductor device fabricating method according to some embodiments of the present inventive concept.

Referring to FIG. 20, the electronic system 1100 according to some embodiments of the inventive concept may include a controller 1110, an input/output device (I/O) 1120, a memory 1130, an interface 1140 and a bus 1150. The controller 1110, the I/O 1120, the memory 1130, and/or the interface 1140 may be connected to one another through the bus 1150. The bus 1150 may correspond to a path through which data moves.

The controller 1110 may include at least one of a microprocessor, a digital signal processor, a microcontroller, and logic elements capable of functions similar to those of these elements. The I/O 1120 may include a keypad, a keyboard and a display. The memory 1130 may store data and/or commands. The interface 1140 may perform functions of transmitting data to a communication network or receiving data from a communication network. The interface 1140 may be wired or wireless. For example, the interface 1140 may include an antenna or a wired/wireless transceiver, and so on. Although not shown, the electronic system 1100 is a working memory for improving the operation of the controller 1110 and may further include a high-speed DRAM and/or SRAM. The semiconductor devices according to some embodiments of the present inventive concept may be provided in the memory 1130 or may be provided as some components of the controller 1110, the I/O 1120, or the like.

The electronic system 1100 may be applied to a wireless communication device, such as a personal digital assistant (PDA), a portable computer, a web tablet, a wireless phone, a mobile phone, a digital music player, a memory card, or any type of electronic device capable of transmitting and/or receiving information in a wireless environment.

Figure 21:
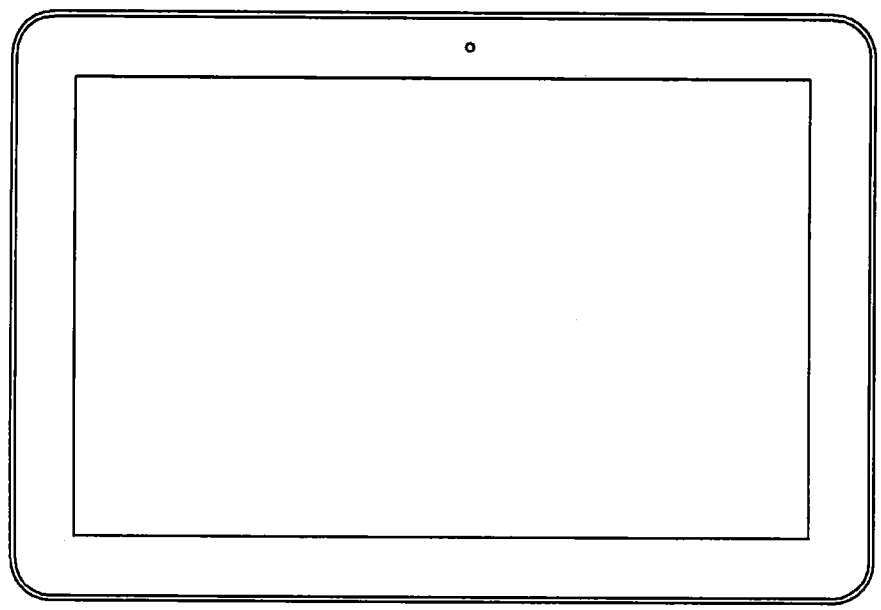
FIGS. 21 and 22 illustrate an example semiconductor system including a semiconductor device fabricated by a method according to some embodiments of the present inventive concept.
Figure 22:
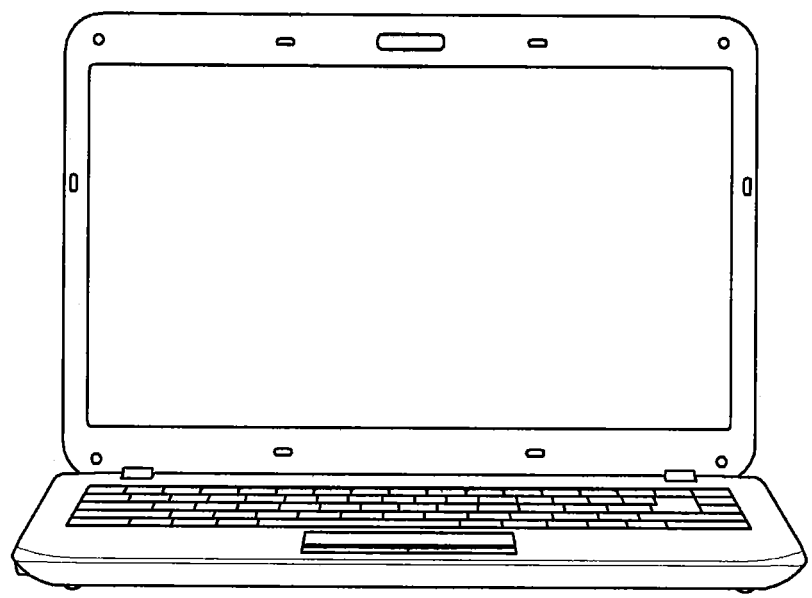

FIGS. 21 and 22 illustrate an example semiconductor system to which semiconductor devices fabricated by semiconductor device fabricating methods according to some embodiments of the present inventive concept can be employed.

Specifically, FIG. 21 illustrates an example in which a semiconductor device according to an embodiment of the present inventive concept is applied to a tablet PC, and FIG. 22 illustrates an example in which a semiconductor device according to an embodiment of the present inventive concept is applied to a notebook computer. It is obvious to one skilled in the art that the semiconductor devices according to some embodiments of the present inventive concept may also be applied to other IC devices not illustrated herein.

While the present inventive concept has been particularly shown and described with reference to some example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the present inventive concept.

What is claimed is:

1. A method of fabricating a semiconductor device, the method comprising:
   forming an interlayer insulation layer on a substrate, the interlayer insulation layer surrounding a dummy silicon gate and exposing a top surface of the dummy silicon gate;
   recessing a portion of the interlayer insulation layer to form a recessed interlayer insulation layer, a portion of the dummy silicon gate protrudes above a top surface of the recessed interlayer insulation layer;
   forming an etch stop layer on the recessed interlayer insulation layer, a top surface of the etch stop layer being coplanarly positioned with the top surface of the dummy silicon gate;
   forming a trench exposing the substrate by removing the dummy silicon gate using the etch stop layer as a mask;
   forming a lower electrode layer along the top surface of the etch stop layer and side surfaces and a bottom surface of the trench;
   forming an upper electrode layer on the lower electrode layer, the upper electrode layer filling the trench and covering the top surface of the recessed interlayer insulation layer;
   planarizing the lower electrode layer and the upper electrode layer to expose the etch stop layer;
   after the exposing of the etch stop layer, removing portions of the lower electrode layer and the upper electrode layer in the trench to form a recess;
   forming a capping layer filling the recess and covering the top surface of the etch stop layer; and
   forming a capping pattern in the trench by removing the capping layer on the top surface of the etch stop layer.

2. The method of claim 1, wherein the forming of the etch stop layer comprises:
   forming a pre-etch stop layer including a first part formed on the top surface of the dummy silicon gate and a second part formed on the top surface of the recessed interlayer insulation layer; and
   removing the first part of the pre-etch stop layer,
   wherein the second part of the pre-etch stop layer is on the top surface of the recessed interlayer insulation layer after removing the first part of the pre-etch stop layer.

3. The method of claim 2, wherein the first part of the pre-etch stop layer is removed by a chemical mechanical polishing (CMP) process.

4. The method of claim 1, wherein the forming of the etch stop layer comprises exposing the top surface of the dummy silicon gate.

5. The method of claim 1, wherein the forming of the interlayer insulation layer comprises forming the interlayer insulation layer having a top surface that is coplanar with the top surface of the dummy silicon gate.

6. The method of claim 1, wherein the etch stop layer includes a material having an etching selectivity to the interlayer insulation layer and the dummy silicon gate.

7. The method of claim 1, wherein the etch stop layer includes at least one of silicon nitride, silicon carbonitride, silicon carbide and silicon oxynitride.

8. The method of claim 1, wherein a distance from a top surface of the substrate to a bottom surface of the recess is smaller than a distance from the top surface of the substrate to the top surface of the recessed interlayer insulation layer.

9. The method of claim 1, wherein the forming of the capping pattern comprises exposing the top surface of the recessed interlayer insulation layer by removing the etch stop layer.

10. A method of fabricating a semiconductor device, the method comprising:
    forming an interlayer insulation layer on a substrate, the interlayer insulation layer covering a dummy silicon gate and a gate hard mask sequentially stacked;
    exposing the dummy silicon gate by removing the interlayer insulation layer and the gate hard mask on the dummy silicon gate;
    after removing the gate hard mask, recessing a portion of the interlayer insulation layer to form a recessed interlayer insulation layer, a portion of the dummy silicon gate protruding above a top surface of the recessed interlayer insulation layer;
    forming a pre-etch stop layer on the top surface of the recessed interlayer insulation layer and the portion of the dummy silicon gate protruding above the top surface of the recessed interlayer insulation layer;

forming an etch stop layer exposing the dummy silicon gate by removing the pre-etch stop layer formed on a top surface of the dummy silicon gate using a first chemical mechanical polishing (CMP) process; and forming a trench exposing the substrate by removing the dummy silicon gate after the forming of the etch stop layer, wherein the removing of the interlayer insulation layer and the gate hard mask on the dummy silicon gate comprises planarizing the interlayer insulation layer using a second CMP process such that a top surface of the interlayer insulation layer and the top surface of the dummy silicon gate are coplanarly positioned.

11. The method of claim 10, wherein the first CMP process is performed using a slurry and is terminated when the slurry is brought into contact with the dummy silicon gate.

12. The method of claim 10, wherein the pre-etch stop layer includes a lower pre-etch stop layer and an upper pre-etch stop layer, the lower pre-etch stop layer is formed by atomic layer deposition, and the upper pre-etch stop layer is formed on the lower pre-etch stop layer by chemical vapor deposition.

13. The method of claim 10, further comprising:
forming a replacement metal gate electrode filling a portion of the trench;
forming a capping pattern filling the trench on the replacement metal gate electrode; and
forming a self-aligned contact adjacent the replacement metal gate electrode and through the recessed interlayer insulation layer.

14. A method of fabricating a semiconductor device, the method comprising:
forming a plurality of first dummy gate structures on a first region of a substrate, wherein a distance between two adjacent ones of the first dummy gate structures is a first distance, and wherein each of the plurality of first dummy gate structures comprises a first dummy silicon gate and a first gate mask that are sequentially stacked on the substrate;
forming a plurality of second dummy gate structures on a second region of the substrate, wherein a distance between two adjacent ones of the second dummy gate structures is a second distance that is greater than the first distance, and wherein each of the plurality of second dummy gate structures comprises a second dummy silicon gate and a second gate mask that are sequentially stacked on the substrate;
forming an interlayer insulation layer on sides of the plurality of first dummy gate structures and sides of the plurality of second dummy gate structures the substrate;
removing the first gate masks of the plurality of first dummy gate structures to expose top surfaces of the first dummy silicon gates and removing the second gate masks of the plurality of second dummy gate structures to expose top surfaces of the second dummy silicon gates;
after removing the first gate masks of the plurality of first dummy gate structures and the second gate masks of the plurality of second dummy gate structures, recessing a portion of the interlayer insulation layer to form a recessed interlayer insulation layer, the first dummy silicon gates and the second dummy silicon gates protruding above a top surface of the recessed interlayer insulation layer;
forming a pre-etch stop layer on the top surface of the recessed interlayer insulation layer and the first and second dummy silicon gates, wherein a shortest distance from a top surface of the substrate to an upper surface of the pre-etch stop layer on the second region is greater than a distance from the top surface of the substrate to the top surfaces of the second dummy silicon gates; and
removing the pre-etch stop layer on the first and second dummy silicon gates using a first chemical mechanical polishing (CMP) process to form an etch stop layer on the recessed interlayer insulation layer,
wherein a top surface of the etch stop layer in the first region and a top surface of the etch stop layer in the second region are coplanarly positioned, and
wherein the forming of the interlayer insulation layer and the removing of the first gate masks on the first dummy silicon gates and the second gate masks on the second dummy silicon gates comprises planarizing the interlayer insulation layer using a second CMP process such that a top surface of the interlayer insulation layer, the top surfaces of the first dummy silicon gates and the top surfaces of the second dummy silicon gates are coplanarly positioned.

15. The method of claim 14, wherein the top surfaces of the first dummy silicon gates, the top surfaces of the second dummy silicon gates and the top surface of the etch stop layer are coplanar after the etch stop layer is formed.

16. The method of claim 14, wherein a top surface of a first portion of the pre-etch stop layer between the first dummy gate structures and a top surface of a second portion of the pre-etch stop layer between the second dummy gate structures are coplanar after the first CMP process.

17. The method of claim 14, after the forming of the etch stop layer, further comprising:
removing the first dummy silicon gates and the second dummy silicon gates to form a plurality of first trenches and a plurality of second trenches, exposing the substrate; and
forming a plurality of first replacement metal gate electrodes in respective ones of the plurality of first trenches and a plurality of second replacement metal gate electrodes in respective ones of the plurality of second trenches.

* * * * *